(12) United States Patent
Jin et al.

(10) Patent No.: US 10,122,381 B2
(45) Date of Patent: Nov. 6, 2018

(54) METHOD OF CONSTRUCTING FLAT XOR CODES FROM INTEGER INDEXED TANNER GRAPHS

(71) Applicant: Agency For Science, Technology And Research, Singapore (SG)

(72) Inventors: Chao Jin, Singapore (SG); Weiya Xi, Singapore (SG); Khai Leong Yong, Singapore (SG); Shibin Chen, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 15/508,718

(22) PCT Filed: Sep. 29, 2015

(86) PCT No.: PCT/SG2015/050353
§ 371 (c)(1),
(2) Date: Mar. 3, 2017

(87) PCT Pub. No.: WO2016/053188
PCT Pub. Date: Apr. 7, 2016

(65) Prior Publication Data
US 2017/0279462 A1    Sep. 28, 2017

(30) Foreign Application Priority Data

Oct. 3, 2014    (SG) .......................... 10201406332W

(51) Int. Cl.
*H03M 13/00* (2006.01)
*H03M 13/11* (2006.01)
(Continued)

(52) U.S. Cl.
CPC ..... *H03M 13/1102* (2013.01); *H03M 13/036* (2013.01); *H03M 13/373* (2013.01); *H03M 13/05* (2013.01)

(58) Field of Classification Search
None
See application file for complete search history.

(56) References Cited

U.S. PATENT DOCUMENTS

2010/0083069 A1    4/2010  Wylie et al.
2010/0115335 A1*   5/2010  Wylie ..................... G06F 11/10
                                                              714/25
(Continued)

OTHER PUBLICATIONS

Greenan, K.M. et al., Flax XOR-based erasure codes in storage systems: Constructions, efficient recovery, and tradeoffs, Proceedings of the 26th IEEE symposium on Massive Storage Systems and Technologies, 14 pages (2010).
(Continued)

*Primary Examiner* — Daniel F. McMahon
(74) *Attorney, Agent, or Firm* — Choate, Hall & Stewart LLP

(57) ABSTRACT

A method for defining an erasure code for system having a predetermined number of data disks is disclosed. The method includes selecting step, constructing step, determining step and repeating step. The selecting step includes selecting a predetermined acceptable number of failures for the system. The constructing step includes constructing a first Tanner graph for two failures acceptable system having predetermined number of data disks. The determining step includes determining erasure code from the first Tanner graph. The repeating step includes repeating the constructing step and the determining step by increasing the acceptable number of failures by one and constructing another Tanner graph in response to the increased acceptable number (Continued)

of failures by increasing number of parity nodes until the predetermined number of failures for the system is reached.

10 Claims, 12 Drawing Sheets

(51) Int. Cl.
  *H03M 13/03* (2006.01)
  *H03M 13/37* (2006.01)
  *H03M 13/05* (2006.01)

(56) References Cited

U.S. PATENT DOCUMENTS

2010/0235677 A1* 9/2010 Wylie ................. G06F 11/1044
  714/5.1
2011/0307756 A1 12/2011 Nguyen et al.

OTHER PUBLICATIONS

Hafner, J.L., Weaver Codes: Highly Fault Tolerant Erasure Codes for Storage Systems, FAST05 Proceedings of the 4th conference on UNESIX Convference on File and Storage Technologies, 4:211-224 (2005).
International Search Report for PCT/SG15/50353, 3 pages (dated Nov. 13, 2015).
Written Opinion for PCT/SG15/50353, 4 pages (dated Nov. 13, 2015).

* cited by examiner

METHOD OF CONSTRUCTING FLAT XOR CODES FROM INTEGER INDEXED TANNER GRAPHS

CROSS-REFERENCE TO RELATED APPLICATIONS

The present patent application is a National Stage Entry of International Patent Application No. PCT/SG2015/050353, filed on Sep. 29, 2015 which claims priority to Singapore Patent Application No. 10201406332W filed on 3 Oct. 2014, the contents of each of which are hereby incorporated by reference in their entirety for all purposes herein.

TECHNICAL FIELD

The present invention relates to data storage system. In particular, it relates to an erasure code for data storage system.

BACKGROUND ART

An erasure can be characterized by a tuple of (n, k) parameters. The code word contains a total number of n symbols/columns, among which any k symbols/columns can be used to recover the other n-k symbols/columns in case they are lost. Erasure codes such as replication, RAID-5, and Reed-Solomon codes have long been used in storage systems for tolerating disk/node failures. To enable data recovery upon disk failures, Reed-Solomon codes need to store the lowest amount of redundant data, in which exactly m-disk worth of redundant data is preserved to tolerate arbitrary m disk failures. Codes with this property are called maximum-distance-separable (MDS) codes. On the other hand, replication requires much higher amount of redundant data, as large as or multiple times larger than the original data. However, replication has a much shorter recovery equation, meaning that it has higher recovery efficiency upon disk failures.

Flat XOR-Codes are the kind of codes between replication and MDS codes. Flat XOR-Codes are built solely on XOR operations. They have one-dimensional code structures, and each parity symbol is the XOR sum of a subset of the data symbols. Flat XOR-Codes are not MDS, so they are not as space-efficient as MDS codes. However, Flat XOR-Codes have much shorter recovery equations and their recovery efficiency is much higher than MDS codes. When compared with replication, Flat XOR-Codes are much more space-efficient, although their recovery efficiency is not as good. As a consequence, Flat XOR-Codes can provide elastic trade-offs between storage efficiency and recovery efficiency, thus giving more flexibility for storage systems in the choice of design parameters.

As the other kinds of non-MDS codes, there are Pyramid codes, WEAVER codes, and HOVER codes which sacrifice some storage efficiency for improving recovery efficiency. Pyramid codes are built on multiple levels of MDS codes, and the recovery is done in a level-by-level way like claiming up a pyramid. WEAVER and HOVER codes are non-systematic parity-array XOR-Codes, in which all or parts of the data columns contain parity symbols. However, these Erasure Codes are insufficient in storage efficiency and reconstruction performance.

With regard to Flat XOR-Codes, there are very few methods to construct Flat XOR-Codes, and the number of Flat XOR-Codes is very limited. Furthermore, the existing Flat XOR-Codes can only tolerate up to 3 failures.

Thus, what is needed is a more robust erasure code for data storage systems which optimizes a balance between storage efficiency and recovery efficiency. Furthermore, other desirable features and characteristics will become apparent from the subsequent detailed description and the appended claims, taken in conjunction with the accompanying drawings and this background of the disclosure.

SUMMARY OF INVENTION

According to a first aspect of the present disclosure, a method for defining an erasure code for system having a predetermined number of data disks is provided. The method includes selecting step, constructing step, determining step and repeating step. The selecting step includes selecting a predetermined acceptable number of failures for the system. The constructing step includes constructing a first Tanner graph for two failures acceptable system having predetermined number of data disks. The determining step includes repeating the constructing step and the determining step by increasing the acceptable number of failures by one and constructing another Tanner graph in response to the increased acceptable number of failures by increasing number of parity nodes until the predetermined number of failures for the system is reached.

According to a second aspect of the present disclosure, a non-transient computer readable medium containing program instructions for causing a computer to perform a method for defining an erasure code for a system having a predetermined number of data disks is provided. The method includes selecting step, constructing step, determining step and repeating step. The selecting step includes selecting a predetermined acceptable number of failures for the system. The constructing step includes constructing a first Tanner graph for two failures acceptable system having predetermined number of data disks. The determining step includes repeating the constructing step and the determining step by increasing the acceptable number of failures by one and constructing another Tanner graph in response to the increased acceptable number of failures by increasing number of parity nodes until the predetermined number of failures for the system is reached.

According to a third aspect of the present disclosure, a system having a predetermined number of data disks and a computer to perform a method for defining an erasure code is provided. The method includes selecting step, constructing step, determining step and repeating step. The selecting step includes selecting a predetermined acceptable number of failures for the system. The constructing step includes constructing a first Tanner graph for two failures acceptable system having predetermined number of data disks. The determining step includes repeating the constructing step and the determining step by increasing the acceptable number of failures by one and constructing another Tanner graph in response to the increased acceptable number of failures by increasing number of parity nodes until the predetermined number of failures for the system is reached.

BRIEF DESCRIPTION OF DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with a present embodiment.

Figure 1:
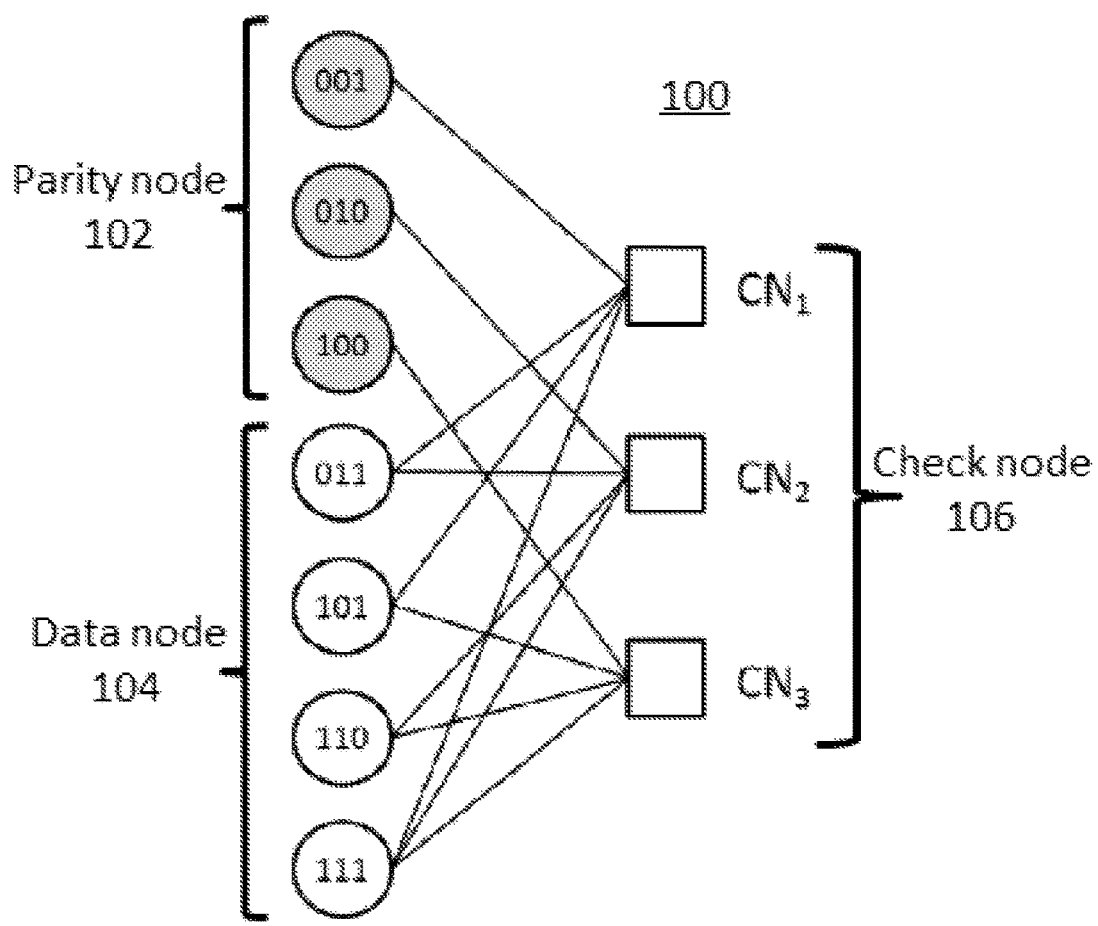
FIG. 1 depicts an example of the Tanner Graph structure of INT2-2 codes in accordance with the present disclosure.

Skilled artisans will appreciate that elements in the figures are illustrated for simplicity and clarity and have not necessarily been depicted to scale. For example, the dimensions of some of the elements in the illustrations, block diagrams or flowcharts may be exaggerated in respect to other elements to help to improve understanding of the present embodiments.

DESCRIPTION OF EMBODIMENTS

The following detailed description is merely exemplary in nature and is not intended to limit the invention or the application and uses of the invention. Furthermore, there is no intention to be bound by any theory presented in the preceding background of the invention or the following detailed description.

Herein, a method for defining an erasure code for a system having a predetermined number of data disks is presented in accordance with present embodiments having the advantages of high storage efficiency and high reconstruction performance.

For a Flat XOR-Code, an intuitive way to describe its construction is through a Tanner graph. A Tanner is a bipartite graph composed of two kinds of nodes, symbol nodes and check nodes. A symbol node represents either a data symbol or parity symbol, and a check node indicates that all symbol nodes connected to it are XOR-summed to zero.

In the present disclosure, a new structure of Tanner Graph is proposed, with each symbol node in the Tanner Graph assigned a distinct integer as its index. The indices can be a set of binary integers, trinary integers, or generally q-nary integers. For each set of integers, a new group of two-failure-tolerant erasure codes is constructed from the corresponding integer indexed Tanner Graphs. Subsequently, a method is proposed to extend the two-failure-tolerant erasure codes to three-failure-tolerant codes. Further, another method is proposed to extend the three-failure-tolerant codes to four and more failure tolerant codes.

The constructed erasure codes (INT-Codes) are Flat XOR codes with one-dimensional code structures. They are easy to be integrated into storage systems and have low computational overhead. Compared with space-optimal MDS codes, INT-Codes can largely improve recovery performance at the cost of small percentage of storage space. Moreover, INT-Codes have the following two advantages compared with other XOR codes:

1) INT-Codes can be constructed to tolerate any number of failures. Currently few XOR-codes can tolerate more than three failures
2) Different levels of INT-Codes can be incrementally constructed, and upgrading to a higher level of failure tolerance requires no change to the original code structure.

The constructions of INT-Codes are based on a novel form of Tanner graphs. To construct a INT-Code with n nodes, a Tanner graph with n symbol nodes is built. Each symbol node corresponds to a data or parity node in the INT-Code structure. Next, each symbol node is assigned a distinct integer as its index. A set of binary integers is selectable as the node indices. Also, a set of trinary integers or generally q-nary integers are selectable as the indices. For a different set of integers, the constructed INT-Codes will be different. INT-Codes constructed from indices of binary integers are denoted as INT2-Codes, INT-Codes constructed from indices of trinary integers are denoted as INT3-Codes, and so on. In the following description, INTx-y represents the INT-Codes which use integers with base x as the node indices and can tolerate y failures.

As an example, how to construct two-failure-tolerant INT-Codes by using INT2-Codes is illustrated. Suppose each binary index has m bits. Firstly, m check nodes are added into the Tanner graph. Secondly, each bit of the index for each symbol node is checked. If the i-th bit is 1, the symbol node is connected to the i-th check node. When this process is done, the Tanner graph is constructed. The resulting INT2-Codes, which can tolerate two node failures, are represents as INT2-2 codes.

FIG. 1 gives an example of the Tanner graph 100 of an INT2-2 code 100 with seven symbol nodes 102, 104. The binary index of each symbol node 102, 104 has three bits such as <001> and therefore three check nodes 106 are added into the Tanner graph. Generally, the indices (except the special all-zero index <000>, which will not be used in two-failure-tolerant codes) can be assigned to the symbol nodes very flexibly as there are no restrictions such that the indices must be contiguous or in a particular order. The symbol nodes 102, 104 are connected to the check nodes 106 according to their indices. For example, the first symbol node <001> in Parity node 102 is connected to the first check node (denoted by $CN_1$) of Check node 106, as the first bit (from the right) of its index is 1, and all the other bits are 0. Since each check node 106 represents an XOR parity stripe, there are actually three parity nodes 102 in the Tanner graph 100 in FIG. 1. A straightforward choice is to select the first three symbol nodes to be parity nodes 102, as shown in FIG. 1. However, any other choices are also allowed. It is because each of these nodes 102 is just a participant in one parity stripe, and is independent from each other.

It is illustrated that the constructed INT2-2 codes can recover from any combination of two symbol node failures. Suppose the i-th and the j-th symbol nodes are lost, and their binary indices are denoted as $IDX_i$ and $IDX_j$ respectively. Since $IDX_i \neq IDX_j$, they must have at least one different bit. Suppose in the r-th bit, $IDX_i$ is 1 and $IDX_j$ is 0. According to the construction of the Tanner graph, it can be determined that the r-th check node is connected to the i-th but not the j-th symbol node. Therefore, the i-th symbol node is the only lost symbol node in the r-th parity stripe, and it can be recovered by calculating the XOR sum of all the other symbol nodes in the parity stripe. Subsequently, the j-th symbol node can be recovered by any one of the parity stripes it participates in.

Figure 2:
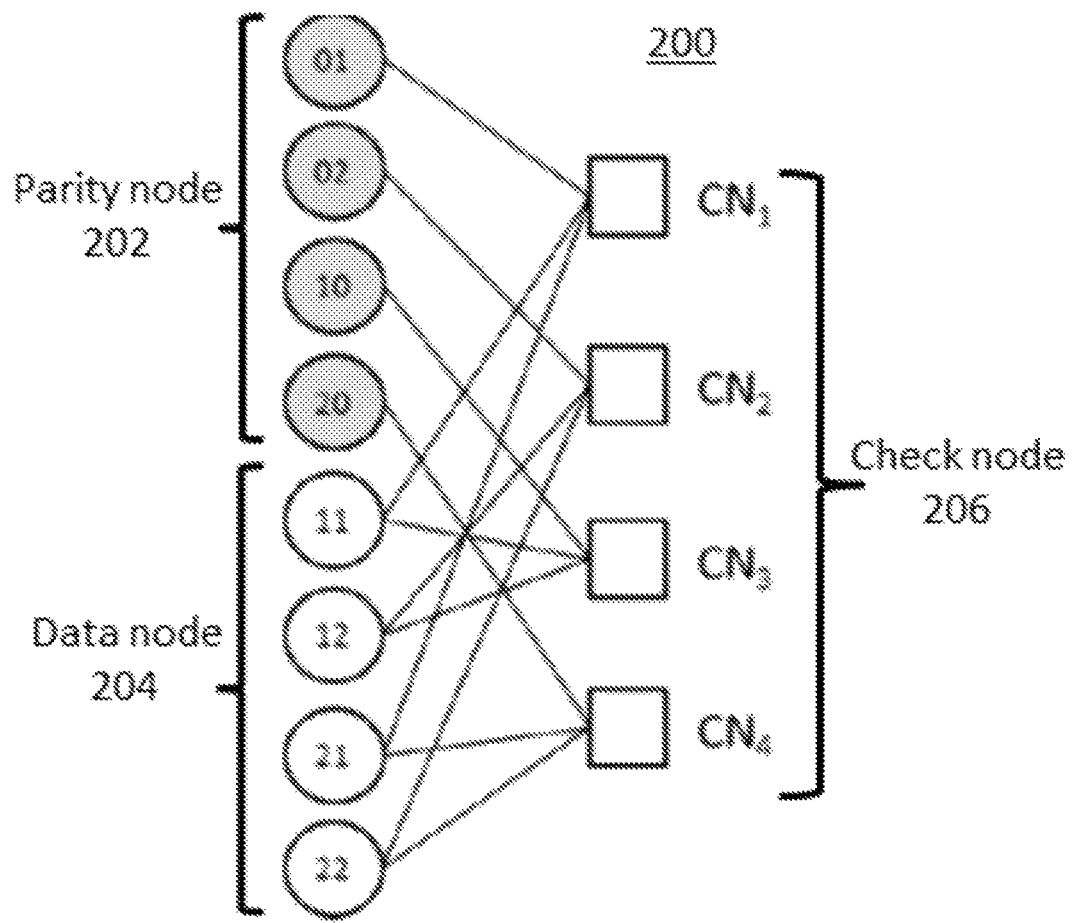
FIG. 2 depicts an example of the Tanner Graph structure of INT3-2 codes in accordance with the present disclosure.

The process of constructing two-failure-tolerant INT3-Codes, i.e., INT3-2 codes 200, is similar to that of INT2-2 codes. FIG. 2 gives an example of INT3-2 codes 200 with eight symbol nodes 202, 204, including four data nodes 204 and four parity nodes 202. As shown in the above, in INT2-2 codes, each bit-value 1 in the index indicates that each of the symbol nodes 102, 104 connects to a corresponding check node 106, and bit-value 0 does nothing. Similarly, in INT3-2 codes, each non-zero bit-value in the index indicates that each of the symbol nodes 202, 204 connects to a check node 206 corresponding to bit-value 1 or bit-value 2, and bit-value 0 does nothing.

Next, the method to extend two-failure-tolerant INT-Codes to three-failure-tolerant INT-Codes is illustrated. As with the property that higher level INT-Codes are incrementally constructed on the basis of lower level INT-Codes, three-failure-tolerant INT-Codes construction is done by just adding one extra parity node into the corresponding two-failure-tolerant INT-Codes construction.

Suppose there is a two-failure-tolerant INT-Code with n symbol nodes. In order to upgrade it into a three-failure-tolerant INT-Code, one more parity node is added into the Tanner graph of the two-failure-tolerant INT-Code, and this parity node is set as the XOR parity of all the n symbol nodes in the original Tanner graph. All the data and parity organizations in the original Tanner graph remain unchanged, and this can greatly simplify the online upgrading of the data reliability for an INT-Codes based storage system.

Figure 3:
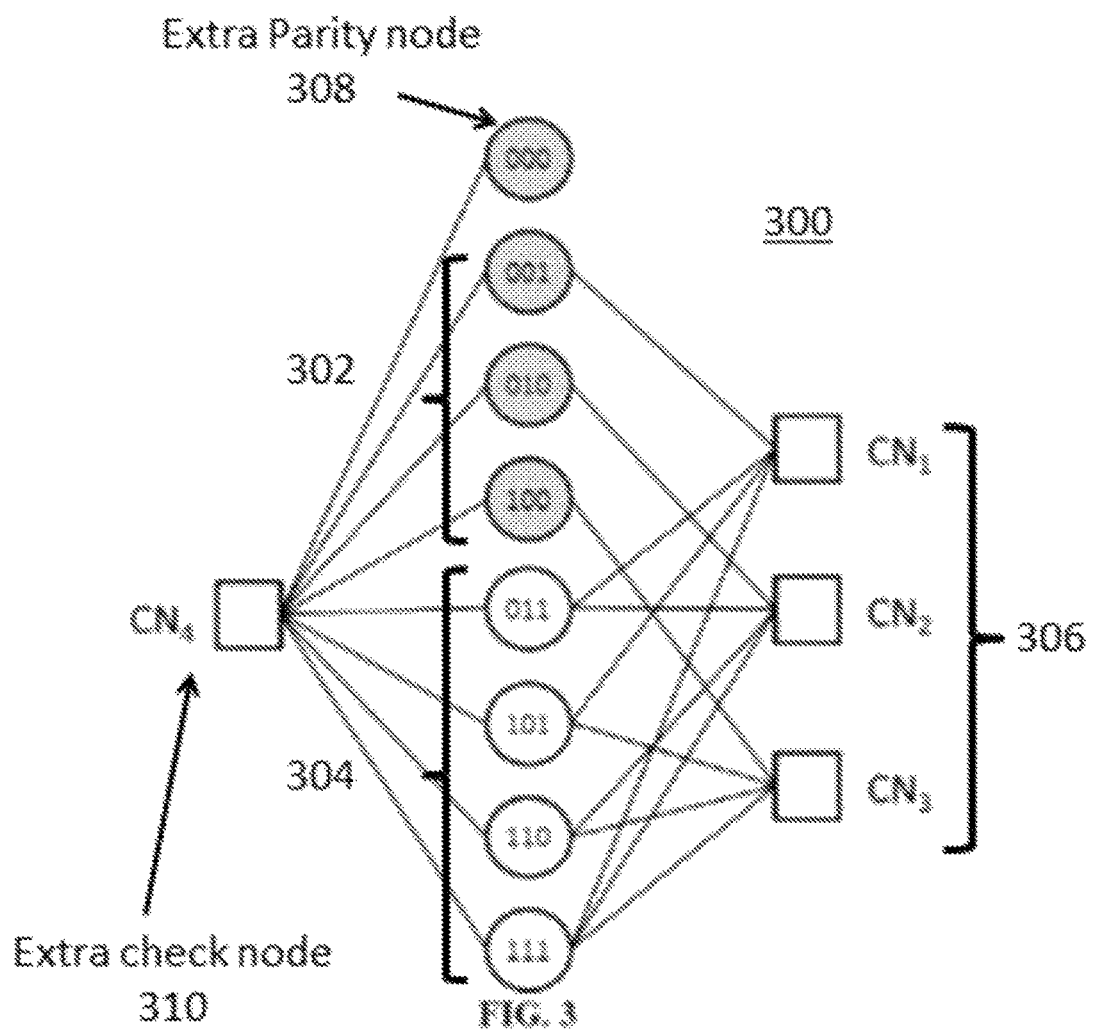
FIG. 3 depicts an example of the Tanner Graph structure of INT2-3 codes based on INT2-2 codes of FIG. 1 in accordance with the present disclosure.

FIG. 3 shows an example of Tanner graph for INT2-3 construction 300. On the basis of the INT2-2 Tanner graph 100 shown in FIG. 1, one symbol node 308 with the special all-zero index <000> is added into the Tanner graph. A new check node 310 is added into the Tanner graph and is connected to all the symbol nodes including the newly added symbol node 308. The newly added symbol node 308 with index <000> is set to be the parity node of the new parity stripe.

Similar to INT2-2, it is illustrated that the three-failure tolerance of INT2-3 through the binary indices in its Tanner graph. Suppose three symbol nodes (denoted as $SN_i$, $SN_j$, and $SN_y$) in the Tanner graph are lost, and their indices are $IDX_i$, $IDX_j$ and $IDX_y$. Since $IDX_i \neq IDX_j$, they must have at least one different bit. Suppose in the r-th bit, $IDX_i$ is 1 and $IDX_j$ is 0, and $IDX_y$ can either be 0 or 1. If the r-th bit of $IDX_y$ is 0, $SN_i$ will be the only lost node in the r-th parity stripe $P_r$, and it can be recovered by $P_r$. Otherwise, if the r-th bit of $IDX_y$ is 1, the following two equations can be formulated.

$$SN_i + SN_y = XOR\_sum \text{ (other SN in Pr)}$$

$$SN_i + SN_j + SN_y = XOR\_sum \text{ (all remaining SN)}$$

The second equation holds because all the symbol nodes in INT2-3 participant in one same parity stripe, the newly added parity stripe compared with INT2-2. By combining the first and second equation, $SN_j$ can be recovered. Pay attention to the fact that, INT2-2 is contained in INT2-3. Therefore, the remaining two lost symbol nodes can certainly be recovered, simply following the method described in INT2-2 recovery.

In INT2-2 codes, if the left and right parts of all the parity equations are added together, the following equation is obtained.

$$XOR\_sum \text{ (data nodes with odd number of 1 in index)} = XOR\_sum \text{ (parity nodes)}.$$

This is because the data nodes which have even number of 1 in their indices will appear even times in the left part of the equation, and their XOR sums will be zero. On the other hand, the data nodes which have odd number of 1 in their indices will appear odd times in the left part of the equation, and their XOR sums will be the same as if each of them appears exactly once.

Based on the above equation, the Tanner graph structure of the INT2-3 codes can be optimized. The newly added parity node with index <000> can be calculated as follows.

$$\text{New parity node} = XOR\_sum \text{ (data nodes with even number of 1 in index)}$$

This is because the newly added parity node is the XOR sum of all the data nodes and parity nodes in INT2-2 codes, and the XOR sum of all data nodes with odd number of 1 in index and all the parity nodes in INT2-2 codes equals zero.

Figure 4:
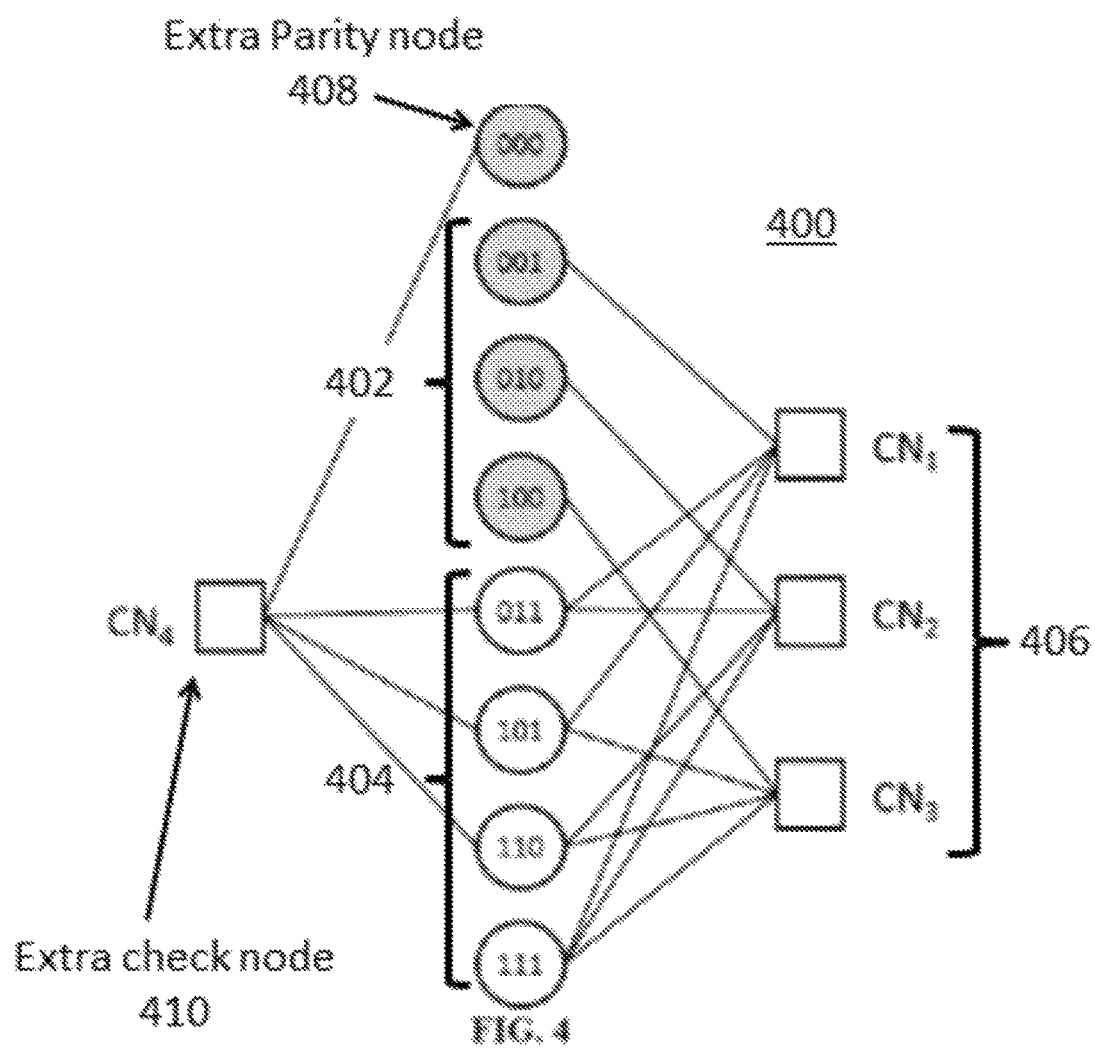
FIG. 4 depicts the optimized Tanner Graph structure of INT2-3 codes in accordance with the present disclosure.

FIG. 4 shows the optimized Tanner graph structure of INT2-3 codes 400. Compared with the original Tanner graph 300 in FIG. 3, the optimized Tanner graph 400 has fewer connections between the new check node 410 and the data nodes 404, thus has shorter recovery equations and better recovery efficiency.

Figure 5:
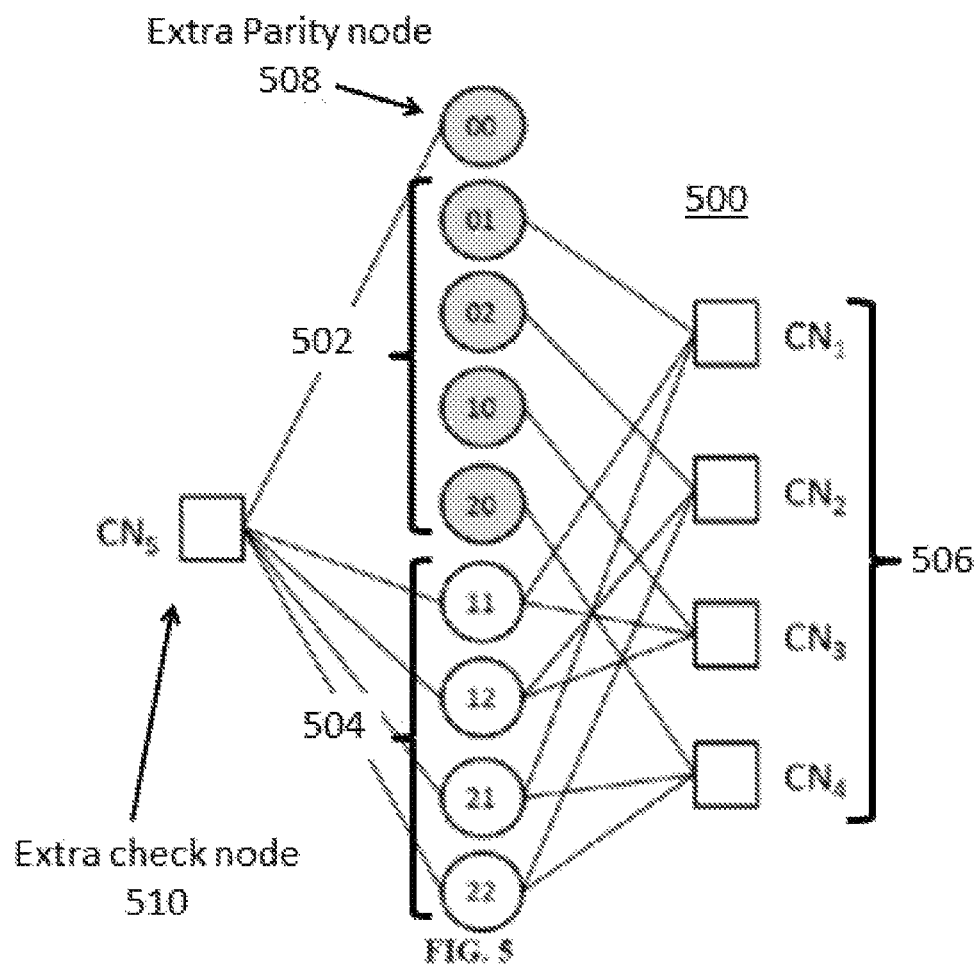
FIG. 5 depicts an example of the Tanner Graph structure of INT3-3 codes based on INT3-2 codes of FIG. 2 in accordance with the present disclosure.

Other groups of two-failure-tolerant INT-Codes (constructed by selecting other set of integers as the node indices in Tanner graph) can be extended to three-failure-tolerant codes in a similar way. FIG. 5 shows the Tanner graph structure 500 of INT3-3 codes. It is constructed by adding a new parity node 508 to the INT3-2 Tanner graph 200 in FIG. 2. Pay attention to the fact that, the optimization method described above also applies to INT3-3 codes and other groups of INT-Codes.

Next, the method to extend three-failure-tolerant INT-Codes to four and more failure tolerant codes is disclosed. Firstly, how to construct four-failure-tolerant INT-Codes is disclosed. And, then a general description on the construction of INT-Codes to tolerate more than four failures is illustrated, which are very similar to the four-failure-tolerant codes constructions.

Four-failure-tolerant INT-Codes are constructed by adding extra parity nodes to three-failure-tolerant INT-Codes. The construction by the example of constructing INT2-4 codes from INT2-3 codes is illustrated. Other groups of four-failure-tolerant INT-Codes can be constructed in a similar way.

Figure 6:
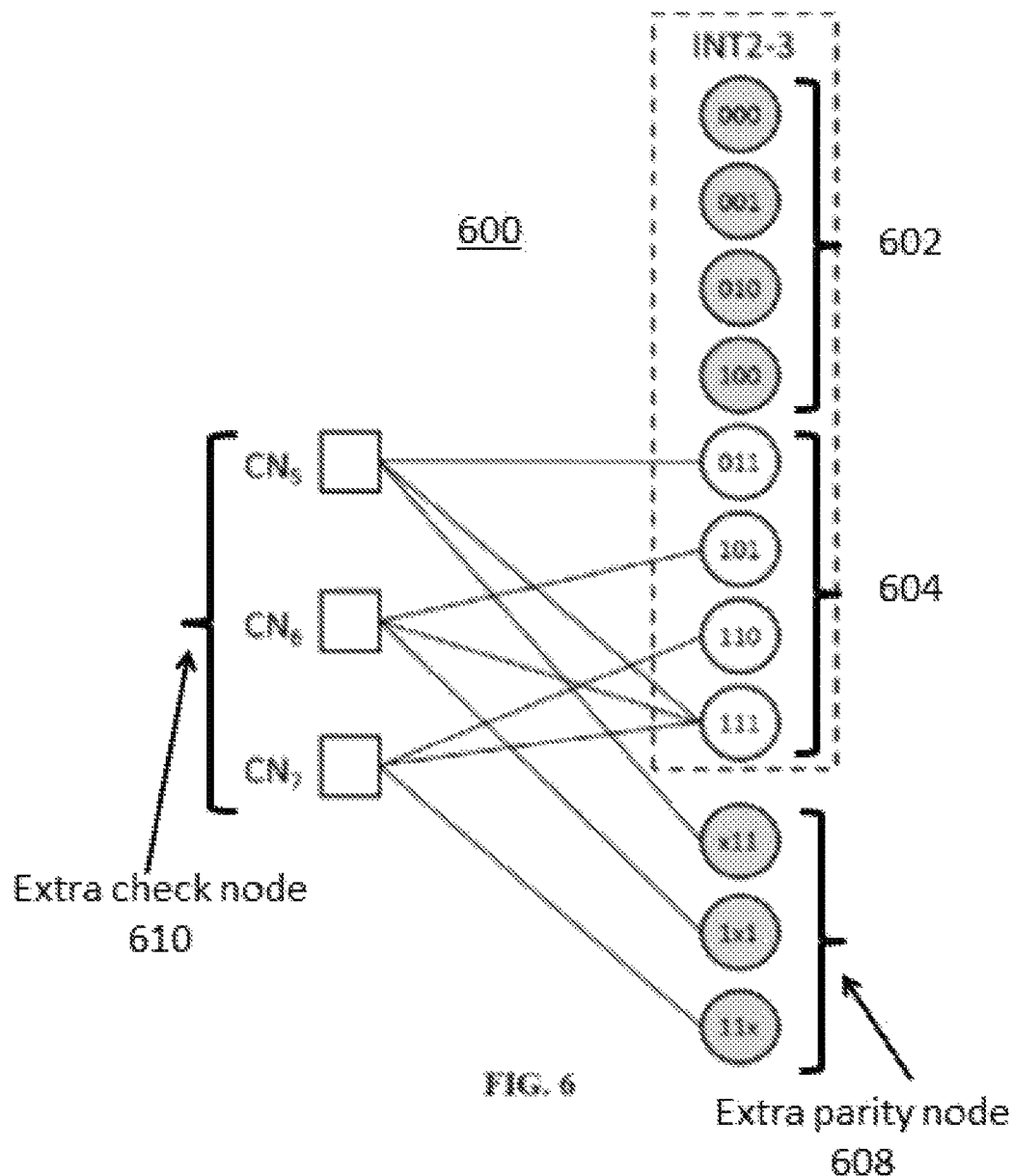
FIG. 6 depicts an example of the Tanner Graph structure of INT2-4 codes based on INT2-3 codes of FIG. 3 or FIG. 4 in accordance with the present embodiment.

FIG. 6 illustrates the Tanner graph of INT2-4 codes 600. The Tanner graph is constructed on the basis of the INT2-3 Tanner graph 400 in FIG. 4. For simplicity, the detailed structure of INT2-3 Tanner graph in the dotted rectangle is omitted. Compared with the INT2-3 Tanner graph, the INT2-4 Tanner graph contains three more parity nodes 608. Each of the three parity nodes 608 connects to a distinct check node 610. Pay attention to the fact that, these parity nodes 608 do not have regular binary indices like the other symbol nodes 602, 604, and they are denoted as <x11>, <1x1>, and <11x> respectively. The INT2-3 symbol nodes which have <x11>-like indices (<011> and <111> in the example) connect to the same check node with the parity node <x11>. Similar rule is applied to the other two parity nodes <1x1> and <11x> and the data nodes.

Generally, to construct an INT2-4 Tanner graph 600 on the basis of an INT2-3 Tanner graph 400, a total number of m-choose-2 parity nodes are added into the Tanner graph, where m is the number of bits in the binary index. Each of the parity nodes corresponds to a combination of two bits in the binary index, and is connected to a distinct check node. If the binary index of an INT2-3 symbol node is 11 at certain combination of two bits, it is connected to the same check node with the corresponding parity node. After connecting all the INT2-3 symbol nodes to the corresponding check nodes, the tanner graph of INT2-4 is constructed.

Constructions of INT2-Codes for tolerating five and more failures are very similar like that of INT2-4. The binary index is a key component in constructing INT2-Codes Tanner graphs. 2-bit-combination 11 is utilized to construct INT2-4 for tolerating four failures. In order to tolerate even more failures, further utilizing combinations of bits is required. For example, to construct INT2-5, each 2-bit combination in the index of a symbol node is further checked, and if its value is 10, the symbol node is connected to a new check node. Accordingly, m-choose-2 new check nodes and m-choose-2 new parity nodes are added into the tanner graph. On the basis of INT2-5, if each 2-bit combination is checked, and the symbol node is connected to a new check node in case the value is 01, six-failure tolerance will be achieved. Still further, comparing each 2-bit combination with the value 00 and adding more check nodes will lead to seven-failure tolerance. When it comes to eight-failure tolerance, what is required is to continue with checking each three-bit combination in the symbol node indices and adding m-choose-3 new check nodes into the tanner graph.

In summary, for tolerating 4 and more failures, it is needed to check the values of combinations of bits in each symbol node index. To tolerate one more failure, one more type of value (e.g., 11, 10, 01, 00, 111, . . . ) is checked, and a corresponding number (i.e., m-choose-i for i-bit combinations) of new check nodes and new parity nodes are added to the tanner graph. Each parity node is connected to a distinct check node, and each symbol node is connected to the check nodes according to the actual value of its binary index.

Next, it is illustrated how to prove the correctness of INT2-4 to INT2-7. The correctness of INT2-8 and beyond can be proved in a similar way. Thanks to the incremental constructions across different levels of INT2-Codes, only to prove the case when all the failures occur in the original INT2-3 code structure is sufficient. The reason is explained by giving INT2-4 as an example. Suppose four failures occur in the INT2-4 Tanner graph. If one or more failures occur in the extra parity nodes (e.g., <x11>, <1x1> and <11x> in FIG. 6) of INT2-4, the original INT2-3 structure must have no more than 3 failures. Then, all the failures in the INT2-3 structure can be recovered, and subsequently all the other failures in the extra parity nodes can also be recovered.

Suppose all the failures occur in the original INT2-3 structure. Firstly, the Differentiate Bit Set D is defined as the set of bit positions in the binary index where not all the indices of the failed symbol nodes are the same. Assume D is sorted in ascending order $\{r_1, r_2, \ldots\}$. According to the value at the $r_1$-th bit, the indices of the failed symbol nodes are divided into two groups, $G_1$ and $G_0$. If the $r_1$-th bit of an index is 1, it is placed in $G_1$. Otherwise, it is placed in $G_0$. $FT_1$ and $FT_0$ are defined as the Failure Tolerance Ability of the two groups. The meaning of $FT_1$ (or $Fr_0$) is that, if the number of indices in $G_1$ (or $G_0$) is no more than $FT_1$ (or $FT_0$), at least one of the symbol nodes in that group can be recovered, otherwise, it is possible that none of them can be recovered. Table 1 shows the values of $FT_1$ and $FT_0$ for INT2-4 to INT2-7.

TABLE 1

| Failure Tolerant | INT2-4 | INT2-5 | INT2-6 | INT2-7 |
|---|---|---|---|---|
| 2-bit combination value checked | 11 | 10 | 01 | 00 |
| $FT_1$ | 2 | 3 | 3 | 3 |
| $FT_0$ | 1 | 1 | 2 | 3 |

Figure 7:
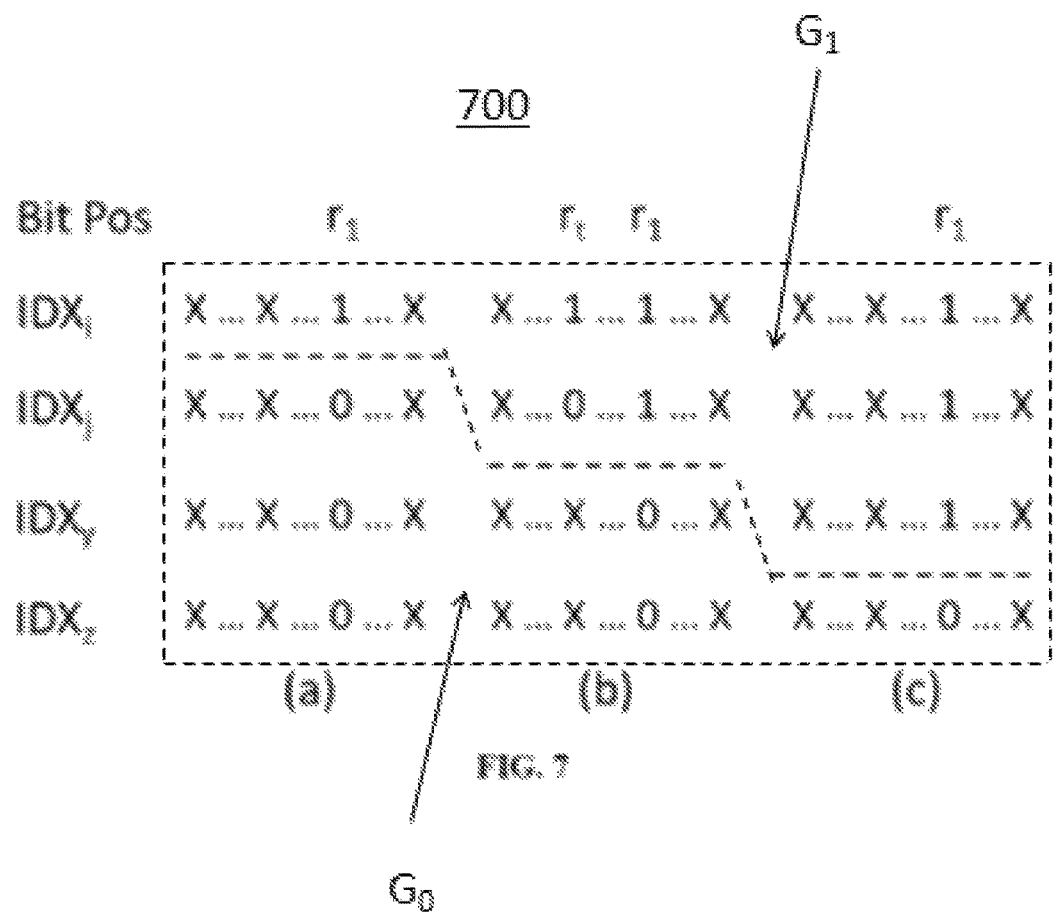
FIG. 7 depicts how INT2-4 codes can tolerate 4 nodes failures by analyzing the node indices in the Tanner Graphs in accordance with the present disclosure.

Take INT2-4 as an example. Assume four symbol nodes failed, and their indices are $IDX_i$, $IDX_j$, $IDX_y$, and $IDX_z$. FIG. 7 shows the possible divisions of the four indices into Group $G_1$ and $G_0$. Indices above the dashed line belong to $G_1$, since they have bit value 1 at the bit position of $r_1$. Similarly, indices under the dashed line belong to $G_0$. Firstly, the following two equations are formulated.

XOR_sum (SN in $G_1$)=XOR_sum (other SN in $Pr_1$)

XOR_sum (SN in $G_1$ and $G_0$)=XOR_sum (other SN in INT2-3)

The first equation holds because all symbol nodes in $G_1$ but $G_0$ participate in the parity stripe $Pr_1$. The second equation holds because all symbol nodes in INT2-3 participate in one same parity stripe (the parity node <000> as shown in FIG. 3). Next, $FT_1$ is proved to be 2, i.e., if there are no more than two symbol nodes in $G_1$, all of them can be recovered. If there is only one symbol node in $G_1$ as shown in FIG. 7(a), it can be directly recovered by the first equation. Suppose there are 2 indices, $IDX_i$ and $IDX_j$, in $G_1$ as shown in FIG. 7(b). Since $IDX_i \neq IDX_j$, they must have at least one different bit (e.g, the $r_t$th bit). For the 2-bit combination of $r_1$ and $r_t$, $IDX_i$ has the value 11 and $IDX_j$ has the value 10. Obviously, the i-th symbol node can be recovered by the extra parity stripe in INT2-4. Subsequently, the j-th symbol node can be recovered by the first equation. However, if there are 3 or more indices in $G_1$ as shown in FIG. 7(c), there is then possibility that none of the symbol nodes are recoverable. Therefore, the Failure Tolerance Ability $FT_1$ of $G_1$ is 2. Similarly, the Failure Tolerance Ability $FT_0$ of $G_0$ is proved to be 1. By combining the first and second equations, the XOR sum of all SNs (Symbol Nodes) in $G_0$ is obtained. If there is just one index in $G_0$, the corresponding symbol node can obviously be recovered. Otherwise, if there are two or more indices in $G_0$, it is possible that none of them can be recovered. Therefore, $FT_0$ of $G_0$ is 1.

Actually, when a new type of value is checked and new check nodes and parity nodes are added to the Tanner graph, either $FT_1$ or $FT_0$ will be increased by 1. The overall Failure Tolerance Ability of INT2-Codes, denoted by FT, can be calculated by the following equation.

$$FT=FT_1+FT_0+1$$

When the total number of failed symbol nodes is equal to or less than FT, it is guaranteed that the number of indices in $G_1$ and $G_0$ will not exceed their Failure Tolerance Abilities $FT_1$ and $FT_0$ at the same time. Therefore, at least one failed symbol node in either $G_1$ or $G_0$ can be recovered. When the first failed node is recovered, all the remaining failed nodes can be recovered subsequently. It is because the Tanner graphs of INT-Codes are constructed in a nested way that a lower-level INT-Code is contained as a part in a higher-level INT-Code.

Figure 8:
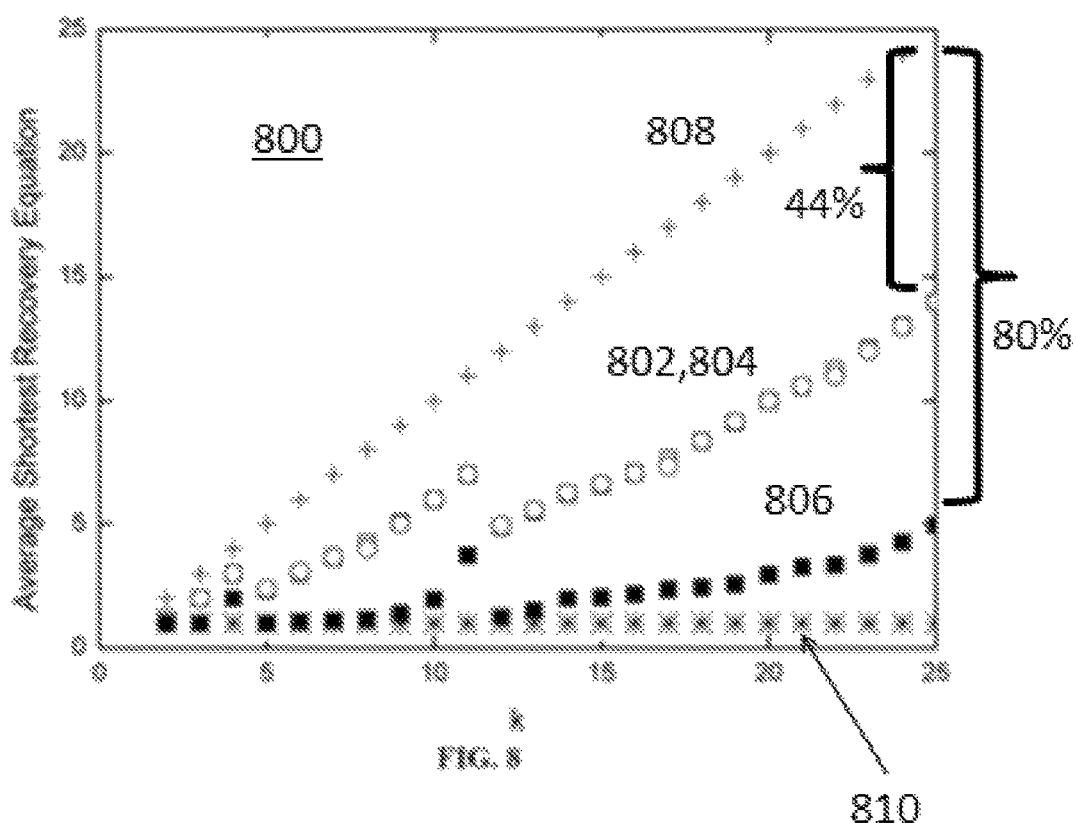
FIG. 8 depicts the comparison of shortest recovery equations for INT2-2, INT2-3 and INT2-4 codes against Replication and MDS codes in accordance with the present disclosure.

FIG. 8 illustrates the comparison of shortest recovery equations 800 for INT2-2 (802), INT2-3 (804) and INT2-4 (806) codes, against Replication 810 and MDS codes 808. Shorter recovery equations mean higher recovery efficiency. The length of recovery equation for Replication 810 remains to be the optimal value of 1. The lengths of recovery equations for MDS codes 808 increase linearly with the number of data nodes. For INT-Codes, the average lengths of shortest recovery equations are between Replication 810 and MDS codes 808. INT-Codes with higher level of failure tolerance have shorter recovery equations. For INT-Codes tolerating 4 and more failures, the lengths of recovery equations reduce gradually close to the optimal value of 1. For example, the shortest recovery equations for INT2-2 (802) and INT2-3 (804) decrease of 44% compared with that for MDS codes 808. The shortest recovery equation for INT2-4 (806) decrease of 80% compared with that for MDS codes 808.

Figure 9:
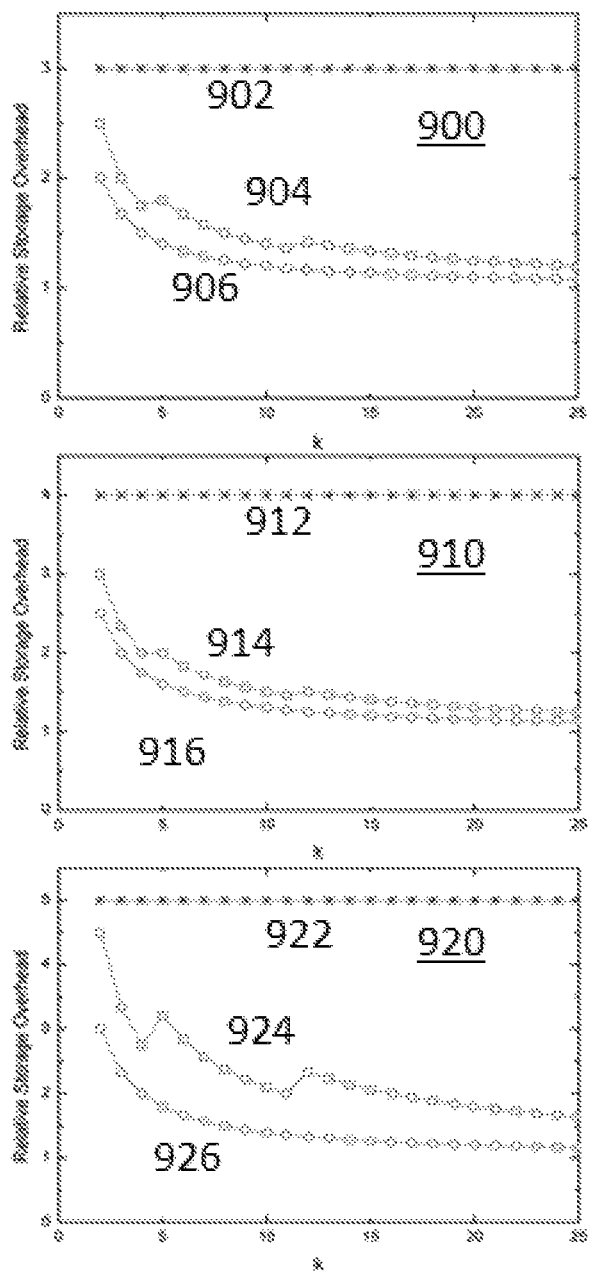
FIG. 9 depicts the comparison of storage overhead for INT2-2, INT2-3 and INT2-4 codes, against Replication and MDS codes in accordance with the present disclosure.

FIG. 9 illustrates the comparison of storage overhead 900, 910, 920 for INT2-2 (904), INT2-3 (914), and INT2-4 (924) codes, against the corresponding Replication 902, 912, 922 and MDS codes 906, 916, 926. Lower storage overhead means higher storage efficiency. Replication has the highest storage overhead, which is consuming n times of storage space for tolerating n failures. MDS codes have the lowest storage overhead. The storage overhead of INT-Codes 904, 914, 924 is between Replication 902, 912, 922 and MDS codes 906, 916, 926, very close the lowest overhead of MDS codes 906, 916, 926.

Compared with MDS codes, INT-Codes according to the present disclosure only lose a small percentage of storage space as shown in FIG. 9. However, INT-Codes according to the present disclosure have much better reconstruction performance as shown in FIG. 8.

Compared with Replication, INT-Codes according to the present disclosure are still much more space efficient as shown in FIG. 9. In some cases, the reconstruction performance of INT-Codes according to the present disclosure increases close to Replication as shown in FIG. 8.

In view of the above explanation, erasure codes in accordance with present disclosure have the advantages of high storage efficiency and high reconstruction performance.

Figure 10:
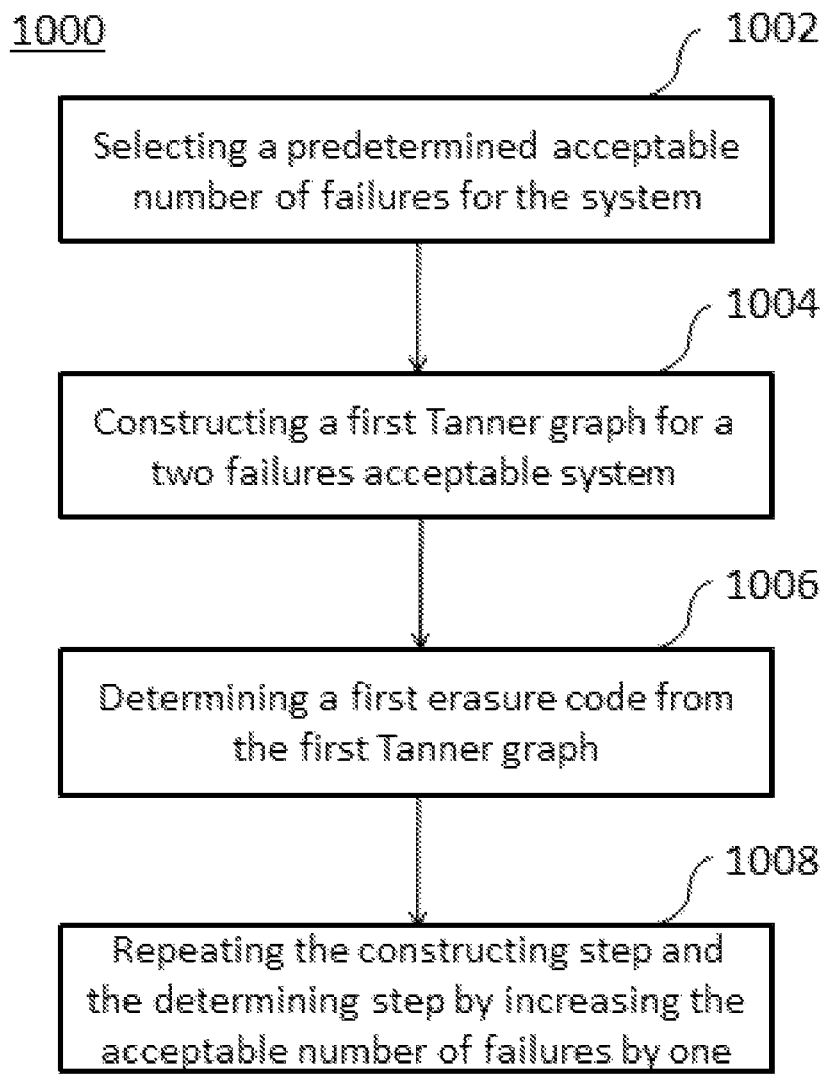
FIG. 10 depicts a flow chart for method of constructing flat XOR codes from integer indexed tanner graphs in accordance with the present disclosure.

FIG. 10 illustrates a flow chart of a method for defining an erasure code for system having a predetermined number of data disks (1000). The method includes selecting step 1002, constructing step 1004, determining step 1006 and repeating step 1008.

The selecting step 1002 includes selecting a predetermined acceptable number of failures for the system. For example, INT2-2 codes 100 in FIG. 1 and INT3-2 codes 200 in FIG. 2 can tolerate 2 node failures. INT2-3 codes 300 in FIG. 3 and INT3-3 codes 500 in FIG. 5 can tolerate 3 node failures. INT2-4 codes 600 in FIG. 6 can tolerate 4 node failures.

The constructing step 1004 includes constructing a first Tanner graph for two failures acceptable system having predetermined number of data disks. This step is explained in more detail with referring to FIG. 11.

The determining step 1006 includes determining erasure code from the first Tanner graph. In this step, 2-failure-tolerant erasure codes is constructed from the corresponding integer-indexed Tanner Graphs such as INT2-2 codes 100 for a set of binary integers as the symbol node indices in the Tanner graph and INT3-2 codes 200 for a set of trinary integers as the symbol node indices in the Tenner graph.

The repeating step 1008 includes repeating the constructing step and the determining step by increasing the acceptable number of failures by one and constructing another Tanner graph in response to the increased acceptable number of failures by increasing number of parity nodes until the predetermined number of failures for the system is reached. In this repeating step, the 2-failure-tolerant erasure codes determined in step 1006 is extended to 3-failure-tolerant erasure codes such as INT2-3 and INT3-3. Further, the 3-failure tolerant erasure codes are extended to 4-failure-tolerant erasure codes such as INT2-4.

Figure 11:
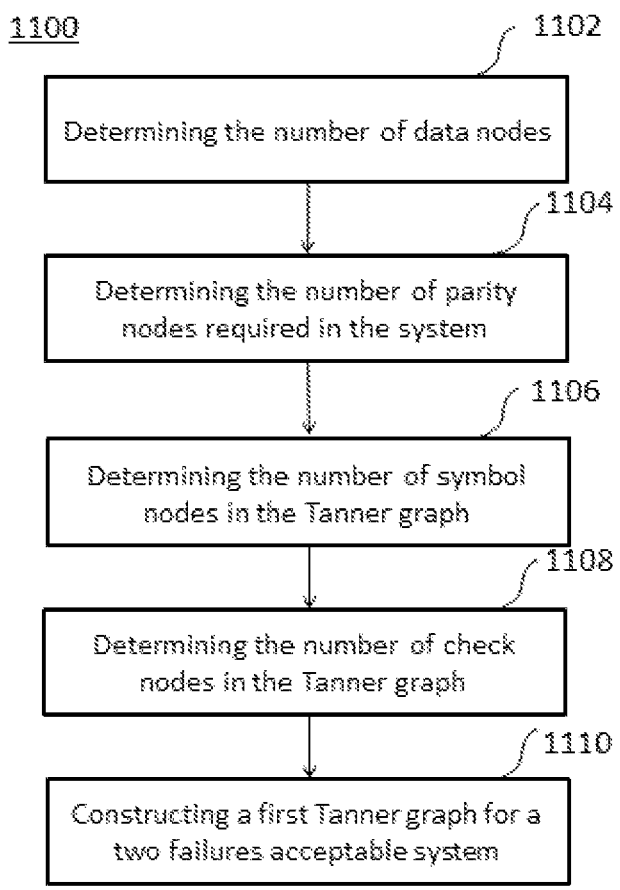
FIG. 11 depicts a flow chart for method of constructing a first tanner graph for two failures acceptable system in accordance with the present disclosure.

FIG. 11 illustrates a flow chart of a method for constructing a first Tanner graph for a two failures acceptable system (1100), which is also described in step 1004 of FIG. 10. The method includes determining steps 1102, 1104, 1106, 1108 and constructing step 1110.

The determining step 1102 includes determining the number of data nodes based on the predetermined number of data disks. Although there are four data nodes in the examples of the present disclosure, the similar implementation can be applied to erasure codes with any number of data nodes.

The determining step 1104 includes determining the number of parity nodes required in the system based on the number of data nodes determined in the step 1102. For example, the number of parity nodes in FIG. 1 is three. Although first three nodes are selected as parity nodes in FIG. 1, the parity nodes can be located in any other way. It is because each of these nodes just participates in a single parity stripe and is independent from each other.

The determining step 1106 includes determining the number of symbol nodes in the Tanner graph in response to the sum of the number of data nodes and parity nodes determined in the steps 1102 and 1104. For example, the number of symbol nodes in FIG. 1 is 7, which is the sum of 4 data nodes and 3 parity nodes. Each symbol node is assigned a distinct integer as its index. A set of binary integers, trinary integers, or generally q-nary integers can be selected as the indices.

The determining step 1108 includes determining the number of check nodes in the Tanner graph from the number of the parity nodes determined in the step 1104. In one example, if a set of binary integers is selected as the node indices and the binary index of each symbol node has m bits, m check nodes are added into the Tanner graph. In FIG. 1, the binary index of each symbol node has 3 bits and 3 check nodes are added into the Tanner graph.

The constructing step 1110 includes constructing a first Tanner graph for a two failures acceptable system by using the number of symbol nodes determined in the step 1106 and check nodes determined in the step 1108. The symbol nodes are connected to the check nodes according to their indices. Generally, the indices can be assigned to the symbol nodes very flexibly as there are no restrictions such that the indices must be contiguous or in a particular order. Therefore, different types of a first Tanner graph can be constructed for a different set of integers and a different way of assigning indices to the symbol nodes.

Figure 12:
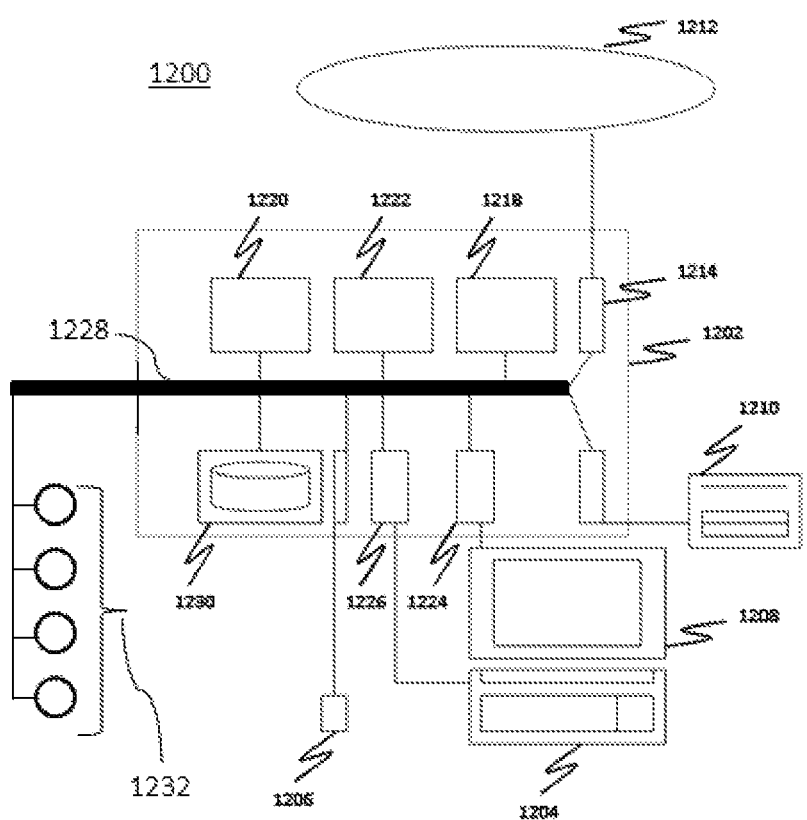
FIG. 12 depicts a system for constructing flat XOR codes from integer indexed tanner graphs in accordance with the present disclosure.

The method and system of the described example embodiments can be implemented on a computer system 1200, schematically shown in FIG. 12. It may be implemented as software, such as a computer program being executed within the computer system 1200, and instructing the computer system 1200 to conduct the method of the example embodiments.

Some portions of the description which follows are explicitly or implicitly presented in terms of algorithms and functional or symbolic representations of operations on data within a computer memory. These algorithmic descriptions and functional or symbolic representations are the means used by those skilled in the data processing arts to convey most effectively the substance of their work to others skilled in the art. An algorithm is here, and generally, conceived to be a self-consistent sequence of steps leading to a desired result. The steps are those requiring physical manipulations of physical quantities, such as electrical, magnetic or optical signals capable of being stored, transferred, combined, compared, and otherwise manipulated.

Unless specifically stated otherwise, and as apparent from the following, it will be appreciated that throughout the present specification, discussions utilizing terms such as "selecting", "constructing", "determining", "repeating", "choosing", "computing", or the like, refer to the action and processes of a computer system, or similar electronic device, that manipulates and transforms data represented as physical quantities within the computer system into other data similarly represented as physical quantities within the computer system or other information storage, transmission or display devices.

The present specification also discloses apparatus for performing the operations of the methods. Such apparatus may be specially constructed for the required purposes, or may comprise a general purpose computer or other device selectively activated or reconfigured by a computer program stored in the computer. The algorithms and displays presented herein are not inherently related to any particular computer or other apparatus. Various general purpose machines may be used with programs in accordance with the teachings herein. Alternatively, the construction of more specialized apparatus to perform the required method steps may be appropriate. The structure of a conventional general purpose computer will appear from the description below.

In addition, the present specification also implicitly discloses a computer program, in that it would be apparent to the person skilled in the art that the individual steps of the method described herein may be put into effect by computer code. The computer program is not intended to be limited to any particular programming language and implementation thereof. It will be appreciated that a variety of programming languages and coding thereof may be used to implement the teachings of the disclosure contained herein. Moreover, the computer program is not intended to be limited to any particular control flow. There are many other variants of the computer program, which can use different control flows without departing from the spirit or scope of the invention.

Furthermore, one or more of the steps of the computer program may be performed in parallel rather than sequentially. Such a computer program may be stored on any computer readable medium. The computer readable medium may include storage devices such as magnetic or optical disks, memory chips, or other storage devices suitable for interfacing with a general purpose computer. The computer readable medium may also include a hard-wired medium such as exemplified in the Internet system, or wireless medium such as exemplified in the GSM mobile telephone system. The computer program when loaded and executed on such a general-purpose computer effectively results in an apparatus that implements the steps of the preferred method.

The computer system 1200 comprises a computer module 1202, input modules such as a keyboard 1204 and mouse 1206 and a plurality of output devices such as a display 1208, and printer 1210.

The computer module 1202 is connected to a computer network 1212 via a suitable transceiver device 1214, to enable access to e.g. the Internet or other network systems such as Local Area Network (LAN) or Wide Area Network (WAN).

The computer module 1202 in the example includes a processor 1218, a Random Access Memory (RAM) 1220 and a Read Only Memory (ROM) 1222. The computer module 1202 also includes a number of Input/Output (I/O) interfaces, for example I/O interface 1224 to the display 1208, and I/O interface 1226 to the keyboard 1204.

The components of the computer module 1202 typically communicate via an interconnected bus 1228 and in a manner known to the person skilled in the relevant art. In one example, a predetermined number of data nodes 1232 are connected to the computer system 1200 via the interconnected bus 1228.

The application program is typically supplied to the user of the computer system 1200 encoded on a data storage medium such as a CD-ROM or flash memory carrier and read utilizing a corresponding data storage medium drive of a data storage device 1230. The application program is read and controlled in its execution by the processor 1218. Intermediate storage of program data may be accomplished using RAM 1220.

While exemplary embodiments have been presented in the foregoing detailed description of the invention, it should be appreciated that a vast number of variations exist. For example, those skilled in the art will realize from the teachings herein that the present technology may also be applied to any part in the other type of erasure codes.

It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

The invention claimed is:

1. A method comprising:
   improving data recovery upon a disk failure in a system having a predetermined number of data disks in which constructed erasure codes (INT-codes) are flat XOR erasure code by:
   selecting a predetermined acceptable number of failures for the system;
   constructing a first Tanner graph for a two failures acceptable system having the predetermined number of data disks;
   determining a first erasure code from the first Tanner graph; and
   repeating the constructing step and the determining step by increasing the predetermined acceptable number of failures by one and (a) constructing another Tanner graph in response to increasing the predetermined acceptable number of failures and an increased number of parity nodes and (b) determining a subsequent erasure code from the another Tanner graph, wherein the constructing another Tanner graph and the determining the subsequent erasure code repeat until an erasure code is determined for the predetermined acceptable number of failures for the system, and wherein the erasure code is flat XOR code in which each strip includes only one element of either data or parity, Tanner graphs constructed from the method include an index for each symbol node that represents either a data symbol or a parity symbol, and encoding and decoding of the erasure code are based on integer indices in the Tanner graphs constructed from the method.

2. The method in accordance with claim 1, wherein the step of constructing a first Tanner graph for a two failures acceptable system comprises:
   determining a number of data nodes based on the predetermined number of data disks;
   determining a number of parity nodes required in the system based on the number of data nodes;
   determining a number of symbol nodes in the first Tanner graph in response to a sum of the number of data nodes and the number of parity nodes;
   determining a number of check nodes in the first Tanner graph from the number of parity nodes; and
   constructing the first Tanner graph for the two failures acceptable system by using the number of symbol nodes and the number of check nodes.

3. The method in accordance with claim 2, wherein the step of determining a number of parity nodes required in the system comprises:
   A) choosing an integer set as node indices;
   B) determining a number of digits in a node index so that each node in the node index has a unique index; and
   C) computing the number of parity nodes.

4. The method in accordance with claim 1, wherein the repeating step further comprises adding both the increased number of parity nodes and an increased number of check nodes into the first Tanner graph to construct a system that tolerates more than three node failures.

5. The method in accordance with claim 1, wherein the repeating step further comprises adding both the increased number of parity nodes and an increased number of check nodes into the first Tanner graph to construct a four failures acceptable system.

6. The method in accordance with claim 1, wherein the repeating step further comprises adding both the increased number of parity nodes and an increased number of check nodes into the first Tanner graph to construct a more than four failures acceptable system.

7. The method in accordance with claim 3, wherein the integer set chosen as the node indices in the first Tanner graph are binary integers.

8. The method in accordance with claim 3, wherein the integer set chosen as the node indices in the first Tanner graph are q-ary (base q) integers.

9. A non-transient computer readable medium containing program instructions for causing a computer to execute a method comprising:
   improving data recovery upon a disk failure in a system having a predetermined number of data disks in which constructed erasure codes (INT-codes) are flat XOR erasure code by:
      selecting a predetermined acceptable number of failures for the system;
      constructing a first Tanner graph for a two failures acceptable system having the predetermined number of data disks;
      determining a first erasure code from the first Tanner graph; and
      repeating the constructing step and the determining step by increasing the predetermined acceptable number of failures by one and (a) constructing another Tanner graph in response to increasing the predetermined acceptable number of failures and an increased number of parity nodes and (b) determining a subsequent erasure code from the another Tanner graph, wherein the constructing another Tanner graph and the determining the subsequent erasure code repeat until an erasure code is determined for the predetermined number of failures for the system, and wherein the erasure code is flat XOR code in which each strip includes only one element of either data or parity, Tanner graphs constructed from the method include an index for each symbol node that represents either a data symbol or a parity symbol, and encoding and decoding of the erasure code are based on integer indices in the Tanner graphs constructed from the method.

10. A system comprising:
an apparatus having a predetermined number of data disks; and
a computer for defining a flat XOR erasure code, having a processor configured to improve data recovery when one of the data disks fails by:
   select a predetermined acceptable number of failures for the system;
   construct a first Tanner graph for a two failures acceptable system having the predetermined number of data disks;
   determine a first erasure code from the first Tanner graph; and
   repeat the constructing step and the determining step by increasing the predetermined acceptable number of failures by one and (a) constructing another Tanner graph in response to increasing the predetermined acceptable number of failures and an increased number of parity nodes and (b) determining a subsequent erasure code from the another Tanner graph, wherein the constructing another Tanner graph and the determining the subsequent erasure code repeat until an erasure code is determined for the predetermined number of failures for the system, and wherein the erasure code is flat XOR code in which each strip includes only one element of either data or parity, Tanner graphs constructed from the computer include an index for each symbol node that represents either a data symbol or a parity symbol, and encoding and decoding of the erasure code are based on integer indices in the Tanner graphs constructed from the computer.

* * * * *